United States Patent [19]

Murakami et al.

[11] Patent Number: 5,600,601
[45] Date of Patent: Feb. 4, 1997

[54] SEMICONDUCTOR MEMORY DEVICE WITH REDUCED CONSUMPTION POWER FOR BIT LINE PRECHARGE

[75] Inventors: Hiroko Murakami; Takaaki Ido; Kenzi Yamada, all of Kasugai, Japan

[73] Assignees: Fujitsu Limited, Kawasaki; Fujitsu VLSI Limited, Kasugai, both of Japan

[21] Appl. No.: 364,985

[22] Filed: Dec. 28, 1994

[30] Foreign Application Priority Data

Feb. 16, 1994 [JP] Japan .................................. 6-019569

[51] Int. Cl.$^6$ ................................................ G11C 7/02
[52] U.S. Cl. .......................... 365/203; 365/233.5; 365/233
[58] Field of Search ................................ 365/203, 204, 365/226, 233.5, 233

[56] References Cited

U.S. PATENT DOCUMENTS

| | | | |
|---|---|---|---|
| 4,922,122 | 5/1990 | Dubujet | 365/233.5 |
| 4,926,384 | 5/1990 | Roy | 365/203 |
| 4,932,001 | 6/1990 | Chow et al. | 365/233.5 |
| 4,969,125 | 11/1990 | Ciraula et al. | 365/203 |
| 5,222,044 | 6/1993 | Tsujimoto | 365/204 |
| 5,365,488 | 11/1994 | Matsushita | 365/203 |
| 5,438,548 | 8/1995 | Houston | 365/233.5 |

*Primary Examiner*—David C. Nelms
*Assistant Examiner*—Vu A. Le
*Attorney, Agent, or Firm*—Nikaido, Marmelstein, Murray & Oram LLP

[57] ABSTRACT

A semiconductor memory device is disclosed for use in writing and reading data. The memory device is provided with a memory cell array including a plurality of word lines, a plurality of bit lines, and a plurality of memory cells connected to each of the word lines and bit lines, respectively. The memory device is provided with a precharger which precharges to set the potential of each bit line to a given level before the data on the memory cells can be read out onto the bit lines. The memory device is responsive to an address signal, and a controller for controlling the precharger. The controller activates the precharger so that all the bit lines are precharged when a previously selected word line changes following the change of the address signal.

2 Claims, 8 Drawing Sheets

CLK

AD

RDo

CLK

AD

A1~
A5

PA1~
PA5

PR

RD

SEMICONDUCTOR MEMORY DEVICE WITH REDUCED CONSUMPTION POWER FOR BIT LINE PRECHARGE

BACKGROUND OF THE INVENTION

1. Field of the Invention

The present invention relates generally to a semiconductor memory device, and more particularly, to the precharge function of a semiconductor memory device which sets the potential of bit lines connected to memory cells to a given level when data is read from the memory cells.

2. Description of the Related Art

The electrical characteristics of memory cells, data lines, and select lines are key aspects when designing large arrays of high speed memory cells. Data line delay characteristics, for example, are a particular concern because they traverse the entire memory array and produce large capacitive loads. Unfortunately, during memory cell read operations, the memory cells themselves must drive the data line capacitance. Consequently, one challenge in designing memory cells is to drive a data line high when a memory cell pull up device charges the capacitance of the data line, and to do so without an unacceptable pull up delay.

One way to minimize the pull up time for highly capacitive lines, is to pull the line to a voltage above the threshold logic when it is not in use. This technique is called precharge because the line is precharged to a value at or near the high logic potential. When performing data read operations, should precharge operations not be performed, data from the memory cells can be erroneously written and destroyed.

Unfortunately, the amount of power required by the precharge operations is usually greater than that required for other memory cell operations. Consequently, when considering ways to reduce the level of power consumed during memory cell operations, reducing the power consumed during precharge operations is an obvious consideration. Moreover, reducing the amount of power consumed during memory cell operations presents the possibility that data access can be performed at higher speeds.

FIG. 1 illustrates a conventional static random access memory (SRAM) 40. The SRAM 40 comprises a memory cell array 41, a precharger 42, a row decoder 43, a column switch 44, a column decoder 45, an address buffer 46, a sense amplifier 47, a write amplifier 48, a control buffer 49 and a clock generator 51.

FIG. 2 shows memory cell array 41, precharger 42, and column switch 44 in detail. The cell array 41 is provided with a plurality of word lines WL1 to WLm, a plurality of bit line pairs (BL1, /BL1) to (BLn, /BLn). A memory cell $C_0$ is connected by a pair of bit lines and a pair of word lines. Each of the cells $C_0$ is formed by a first and a second invertor 52, and 53, and a first and a second gate transistor 54 and 55. When one of the word lines is selected from among each of the word lines WL1 to WLm, and when the potential of the selected word line rises high, data is output from the cell array 41. The data is output from a plurality of cells $C_0$ connected with the selected word line to the associated bit line pairs (BL1,/BL1) to (BLn,/BLn), respectively.

The precharger 42 comprises a plurality of circuits $42A_1$ to $42A_n$ formed by the 4th to 6th transistors 56 to 58. Each of the circuits $42A_1$ to $42A_n$ precharges the associated bit line pairs (BL1, /BL1) to (BLn, /BLn) by means of a power-supply $V_{DD}$. Specifically, the 4th to 6th transistors 56 to 58 turn on to precharge the bit line pairs during the period in which the potential of the clock signal CLK, output by the clock generator 51 during timing cycle t0 (see FIG. 3), is high.

As shown in FIG. 1, the address buffer 46 holds an address signal AD from a CPU or other type of controller (not shown), in synchronism with the rising of the clock signal CLK, and then separates the address signal AD into a row address signal ADR and a column address signal ADC. The address buffer 46 next supplies the row address signal ADR to the row decoder 43, and the column address signal ADC to the column decoder 45.

The control buffer 49 receives the read enable signal RE and the write enable signal WE from the controller, and outputs control signals to decoders 43 and 45 in accordance with both signals RE and WE. The buffer 49 further outputs the read enable signal RE to the sense amplifier 47, and the write enable signal WE to the write amplifier 48.

The row decoder 43 decodes the address signal ADR in response to the control signal input from the control buffer 49, and generates a selection signal SRD. The selection signal SRD is an instruction related to the selection of one of the word lines WL1 to WLm. The row decoder 43 then outputs the selection signal SRD to the memory cell array 41.

The column decoder 45 decodes the address signal ADC in response to the control signal input from the control buffer 49, and generates a selection signal SCD, thus outputting the selection signal SCD to the column switch 44 connected to the cell array 41.

As shown in FIG. 2, the column switch 44 is provided with a plurality of switching pairs $(SC_1, SD_1)$ to $(SC_n, SD_n)$, and is connected to the sense amplifier 47 and the write amplifier 48 through the output line pair $(LC_0, /LC_0)$. Based on the input selection signal SCD, one of the switching pairs $(SC_1, SD_1)$ to $(SC_n, SD_n)$ is turned on. The column switch 44 selectively connects the output line pair $(LC_0,/LC_0)$ and the bit line pair corresponding to the actuated switching pair.

The sense amplifier 47 is activated in response to the input read enable signal RE, and amplifies the data on the cell $C_0$. This data is read out on the selected bit line pair and the output line pair $(LC_0, /LC_0)$ when the clock signal CLK pulse is input high. Then, the sense amplifier 47 outputs the amplified data, i.e., read data $RD_0$, onto the data bus (not shown) which is connected to the SRAM.

The write amplifier 48 connected to the data bus (not shown) is activated in response to the input write enable signal WE, and writes the data, i.e., write data $WD_0$, onto the cell $C_0$ through the output line pair $(LC_0,/LC_0)$, and the selected bit line pair.

When the data is read out from the above-mentioned SRAM 40, the address buffer 46 latches the address signal AD in synchronism with the rising of the clock signal CLK as shown in FIG. 3. Then, the address buffer 46 supplies the row address signal ADR to the row decoder 43, and the column address signal ADC to the column decoder 45.

The row decoder 43 decodes the address signal ADR to the selection signal SRD. Then, based on the signal SRD, a word line WL1 for example is selected. The column decoder 45 decodes the address signal ADC to the selection signal SCD. Then, based on the signal SCD, a pair of switches (e.g., $SC_1$, $SD_1$) are turned on, causing the bit line pair (BL1,/BL1) to connect to the output line pair $(LC_0, /LC_0)$. This describes the selection of the cell $C_0$, connected to the word line WL1 and the bit line pair (BL1, /BL1).

At this time, all of the 4th to 6th transistors 56 to 58 of the precharger 42 are turned on, respectively, during the period when the clock signal CLK is high. Next, the precharger 42 precharges the bit line pairs (BL1, /BL1) to (BLn,/BLn) by means of the power-supply $V_{DD}$.

Thus, based on the data on the selected cell $C_0$, one of the levels of the bit line (BL1, /BL1) is pulled low while the other level is held at the level of the power-supply $V_{DD}$. Data can, in this way, be read out onto the bit line pair (BL1, /BL1). The data thus read out is transferred to the sense amplifier 47 through the output line pair ($LC_0$, /$LC_0$), In this amplifier 47, the read-out data $RD_0$ is output after being amplified.

Next, in response to an incremented address signal AD, the address buffer 46 latches the new address signal AD in synchronism with the rising of the clock signal CLK. Here, the row address signal ADR will not change, and the word line WL1 will still remain selected. On the other hand, the column address signal ADC changes, and the bit line pair (BL2,/BL2) (not shown) are connected to the output line pair ($LC_0$,/$LC_0$). Hence, the cell $C_0$ connected to the word line WL1 and the bit line pair (BL2, /BL2) is selected.

At this time, the precharger 42 precharges all the bit line pairs (BL1,/BL1) to (BLn,/BLn) by means of the power-supply $V_{DD}$ during the period in which the clock signal CLK is high. Data in the selected cell $C_0$ is then read out onto the bit line pair (BL2, /BL2), and output line pair ($LC_0$,/$LC_0$), and output to the sense amplifier 47. The sense amplifier 47 amplifies the read-out data, and outputs it as read-out data $RD_0$.

Thereafter, the word line is selected in response to the incremented address, and at the same time, the bit line pair is connected to the output line pair ($LC_0$, /$LC_0$). In synchronism with the clock signal CLK, the precharger 42 precharges the bit line pairs (BL1, /BL1) to (BLn, /BLn) by means of the power-supply $V_{DD}$. Hence, the data on the cell $C_0$, connected to the selected word line and bit line pair is read out. The sense amplifier 47 amplifies and outputs this data as read-out data $RD_0$. In this way, as shown in FIG. 3, the sense amplifier 47 outputs the read-out data $RD_0$ in synchronism with the falling of the clock signal CLK.

However, in the above-mentioned SRAM 40, the precharger 42 must operate in synchronism with the clock signal CLK each time data is read from a specific cell $C_0$. As a result, precharging is performed with respect to all the bit line pairs (BL1,/BL1) to (BLn,/BLn). This occurs even when the data on a plurality of cells $C_0$ connected to the same word line should be read out one after another. The precharger 42 in this instance, precharges all the bit line pairs (BL1,/BL1) to (BLn,/BLn). Therefore, this precharger 42 inevitably consumes a great amount of power. This causes the power consumption of the SRAM 40 to increase beyond what is necessary for its intended function.

Also, the sense amplifier 47 outputs the read-out data $RD_0$ in synchronism with the falling of the clock signal CLK after the precharging is executed. Therefore, when the data on a plurality of cells connected to the same word line is read out one by one. Read out timing of the data in later cells must inevitably be delayed by an amount equivalent to the precharging period.

SUMMARY OF THE INVENTION

Accordingly, it is a primary objective of the present invention to provide a semiconductor memory device capable of operating at reduced power consumption levels due to precharging of the bit lines connected to a memory cell.

To achieve the foregoing and other objects and in accordance with the purpose of the present invention, an improved semiconductor memory device is provided. As shown in FIG. 4, such memory device is provided with a memory cell array 1 including a plurality of memory cells C connected to a plurality of word lines WL, a plurality of bit line (BL,/BL), each of the word lines WL and each of bit lines (BL,/BL). The memory device is provided with a word line selector 2 which is connected to the word lines WL, and is capable of selecting either one of the plural word lines WL in accordance with an address signal AD. The memory device is provided with a bit line selector 3 which is connected to the bit lines BL and bar BL, and is capable of selecting either one of the plural bit lines (BL, /BL) in accordance with an address signal AD.

The memory device is provided with a precharger 4 for precharging each of bit lines (BL,/BL) to set its potential at a given level before data is read out from the memory cells C to the bit lines (BL, /BL). The memory device is provided with a controller 5, which is responsive to the address signal AD and capable of controlling the precharger 4. The controller 5 activates the precharger 4 to precharge all the bit lines (BL, /BL) when, due to a change in the address signal AD, the word line WL selected in a first reading operations differs from the word line WL selected thereafter.

According to the present invention, all the bit lines are precharged only when the selection of the word lines changes on the basis of the change of the address signals. On the other hands, the bit lines are not precharged even when the address signal changes unless the word line to be selected changes accordingly. As a result, the consumed power of the semiconductor memory device can be reduced.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings, in which:

DETAILED DESCRIPTION OF THE PREFERRED EMBODIMENTS

The description will now be given of a semiconductor memory device according to one embodiment of the present invention with reference to the accompanying drawings.

Figure 1:
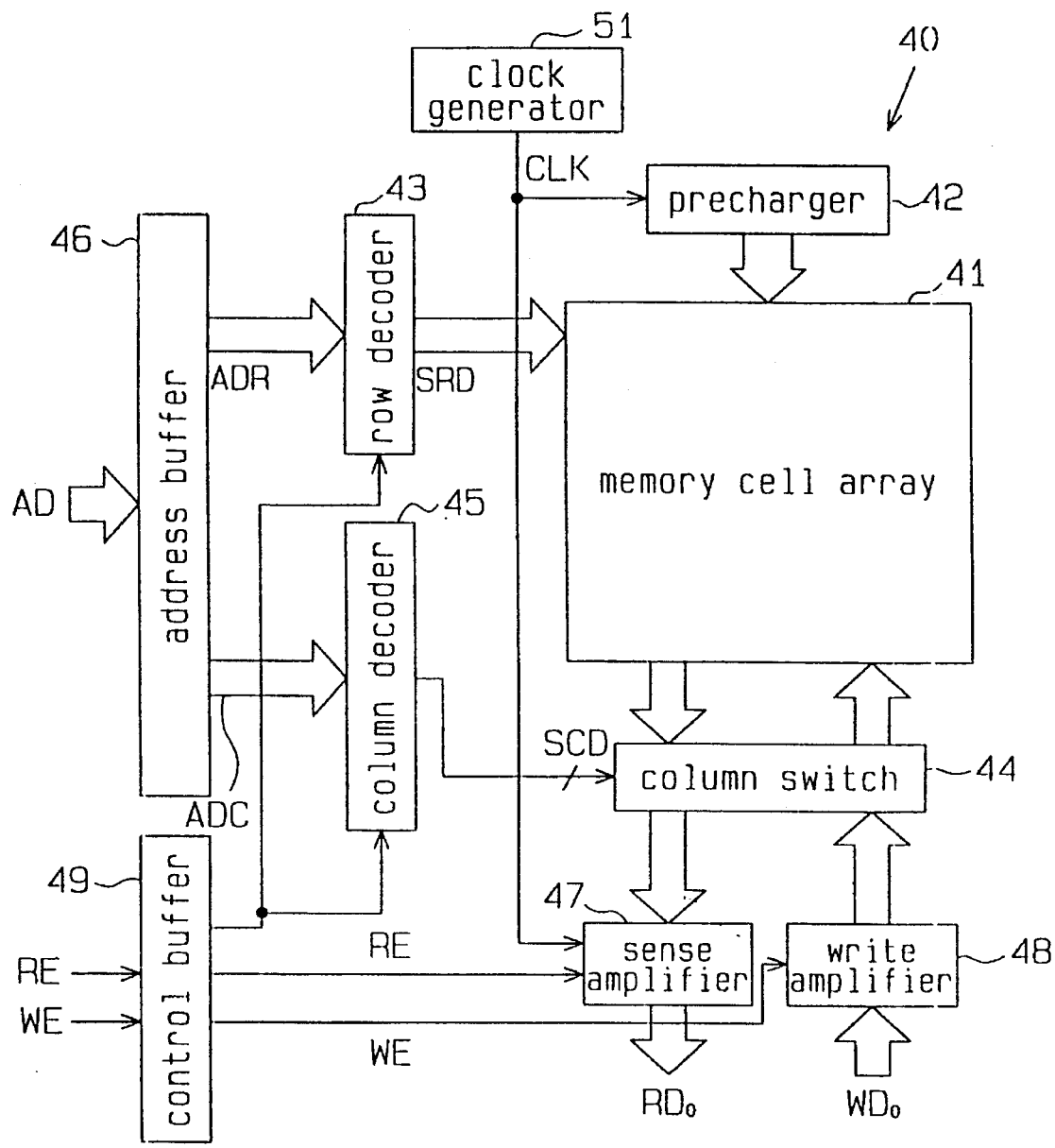
FIG. 1 is a block diagram showing a conventional SRAM.
Figure 2:
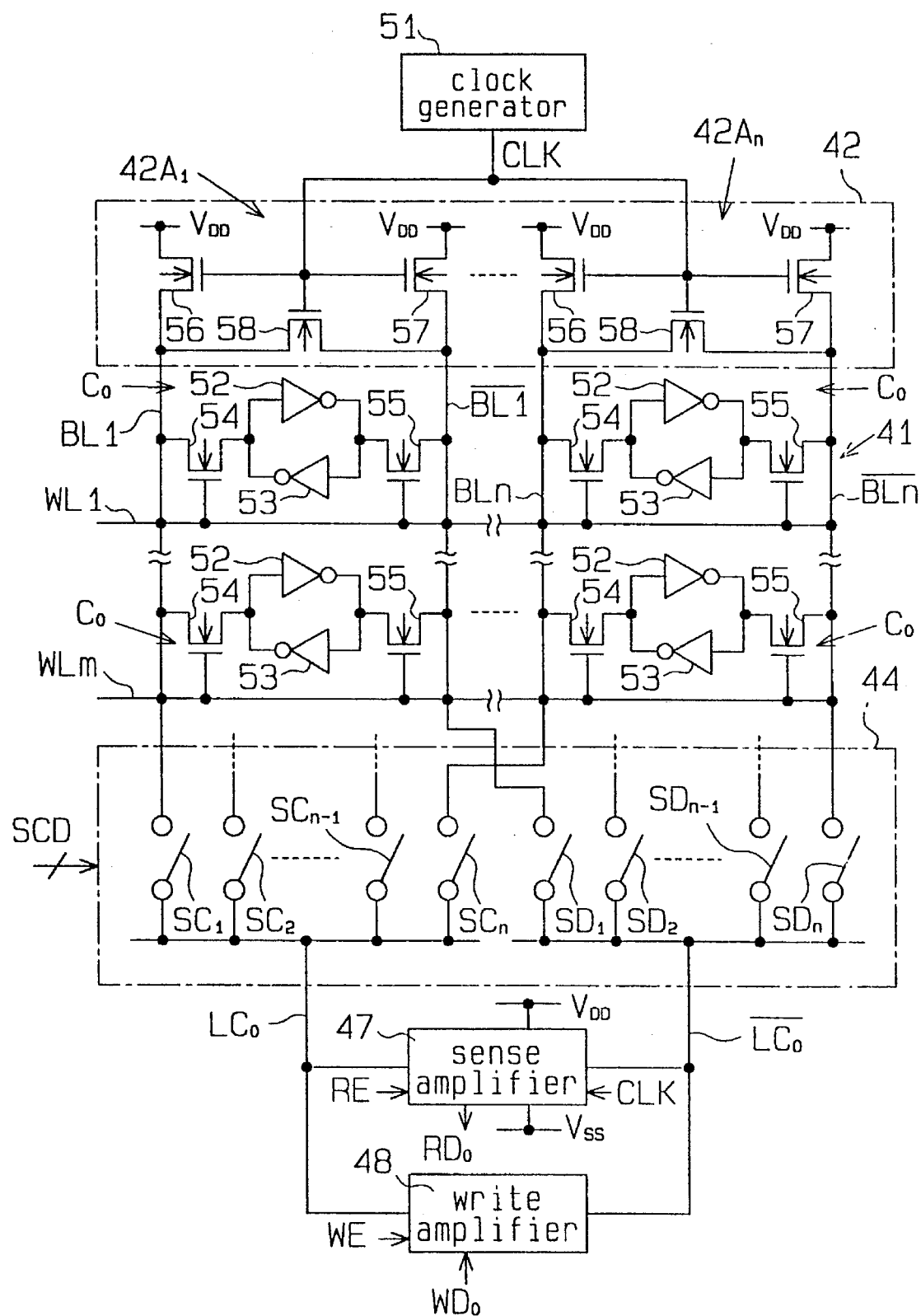
FIG. 2 is a circuit diagram showing in detail the precharger, memory cell array, and column switch in the SRAM presented in FIG. 1.
Figure 3A:
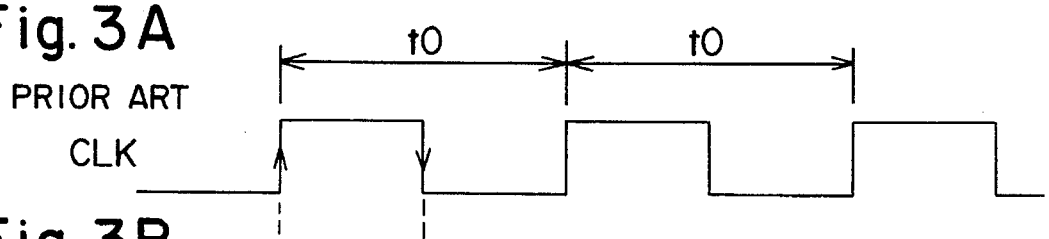
FIG. 3 is a time chart showing the reading operation in the SRAM presented in FIG. 1.
Figure 3B:
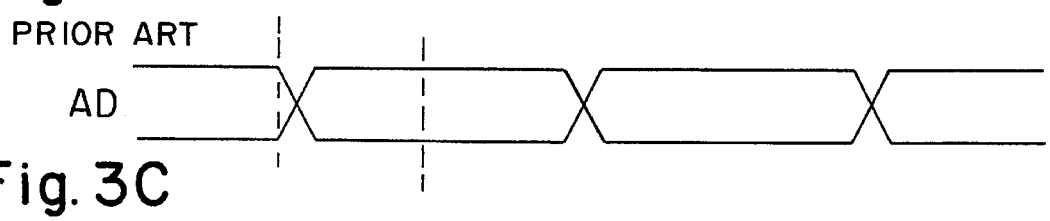
Figure 3C:
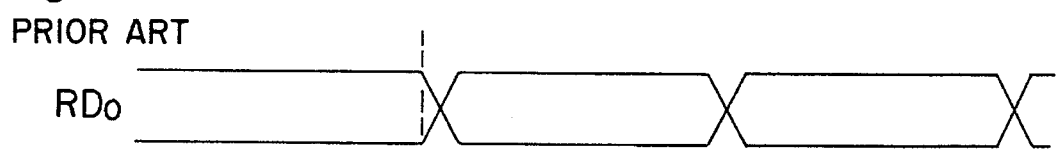
Figure 4:
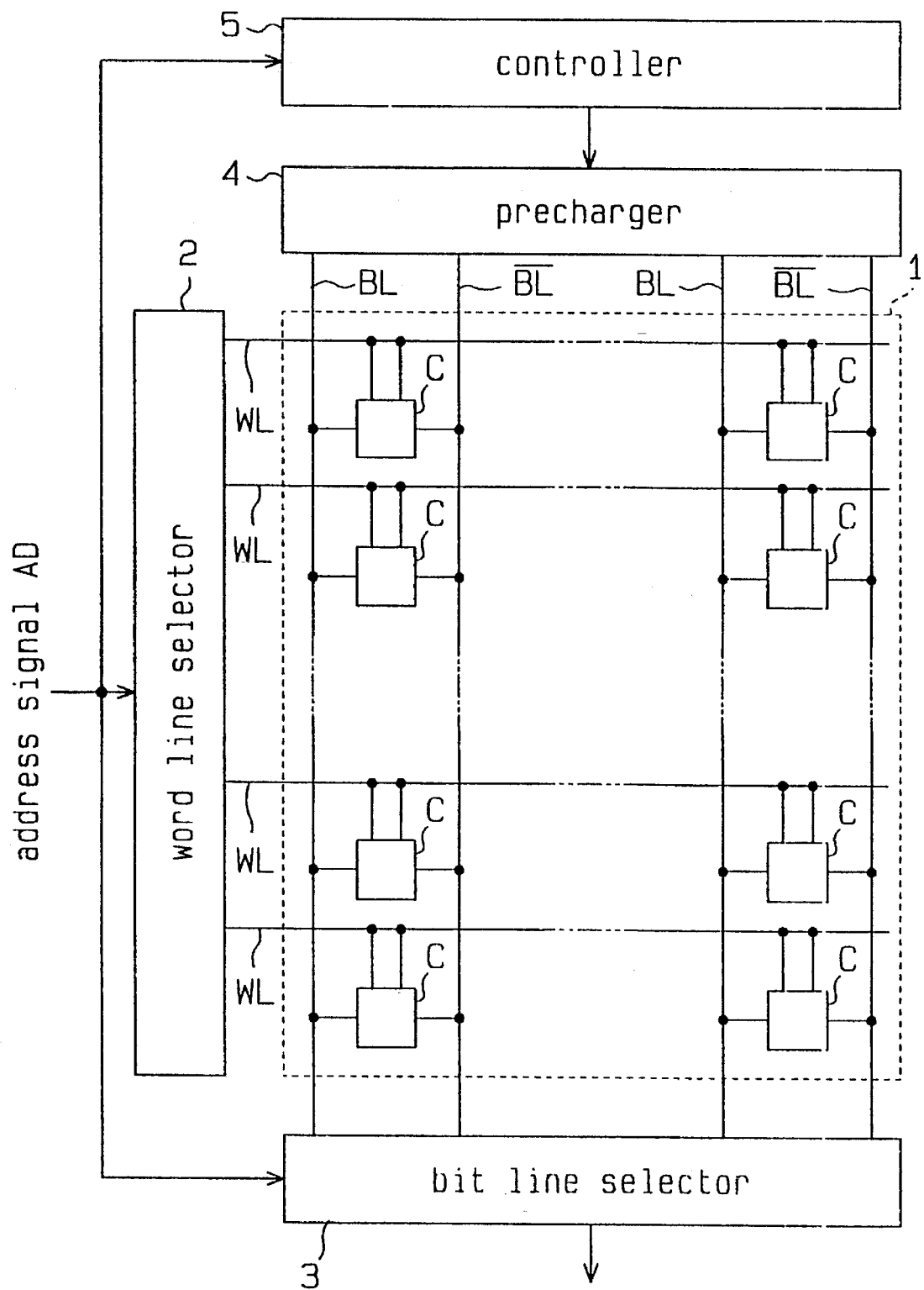
FIG. 4 is a diagram showing the outline of the present invention.
Figure 5:
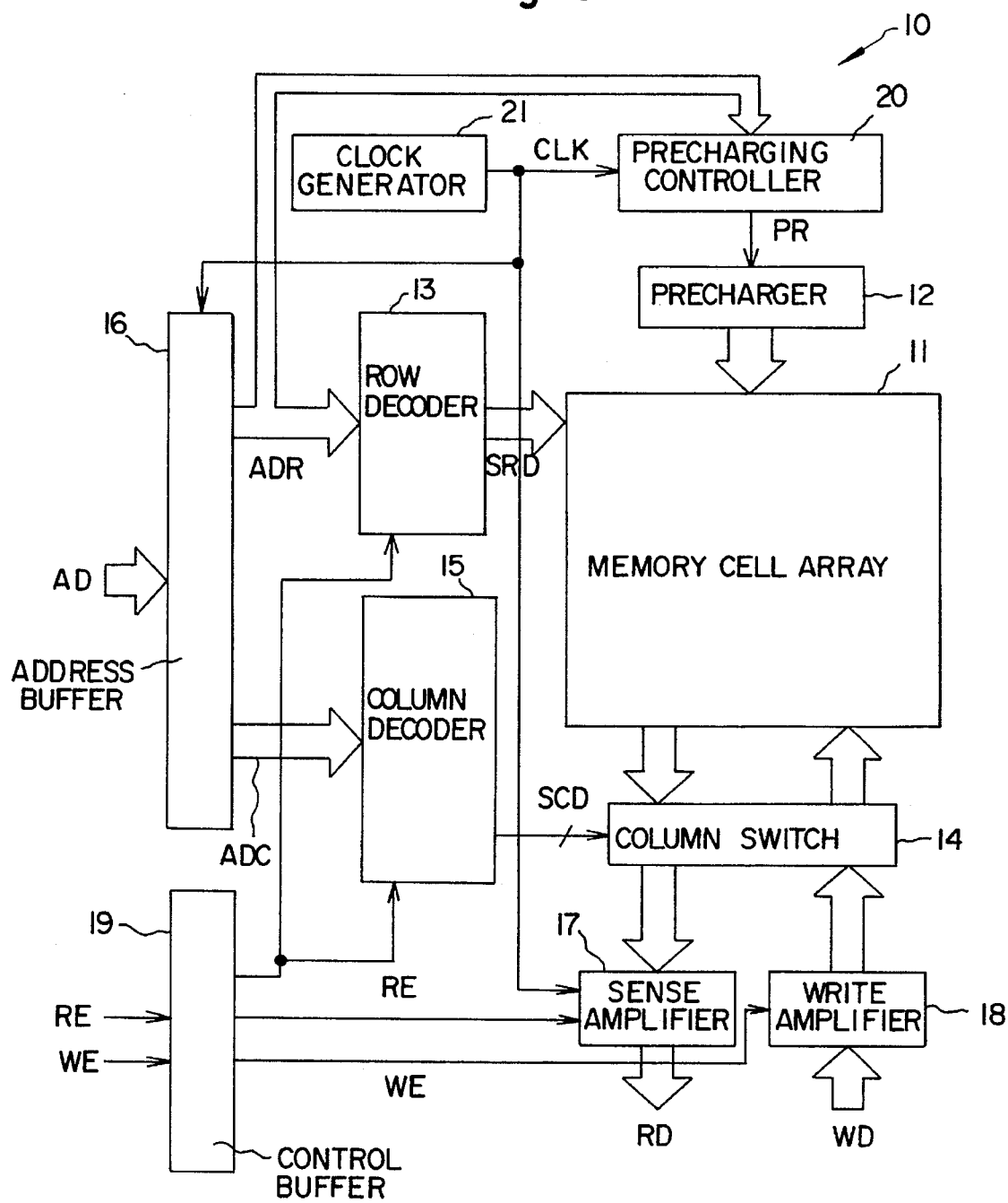
FIG. 5 is a block diagram showing an SRAM according to one embodiment of the present invention.

FIG. 5 shows an SRAM 10 serving as a semiconductor memory device. This SRAM 10 is installed on an LSI used for DSP (digital signal processing), and used for storing program data. The SRAM 10 comprises a memory cell array 11, a precharger 12, a row decoder 13, a column switch 14, a column decoder 15, an address buffer 16, a sense amplifier 17, and a write amplifier 18. Further, the SRAM 10 comprises a control buffer 19, a precharging controller 20, and a clock generator 21. Power to the SRAM 10 is supplied from a high potential power-supply $V_{DD}$ and a low potential power-supply $V_{SS}$. The clock generator 21 outputs the clock signal CLK to the address buffer 16, sense amplifier 17, and precharging controller 20 over a cycle t0 as shown in FIG. 8.

Figure 6:
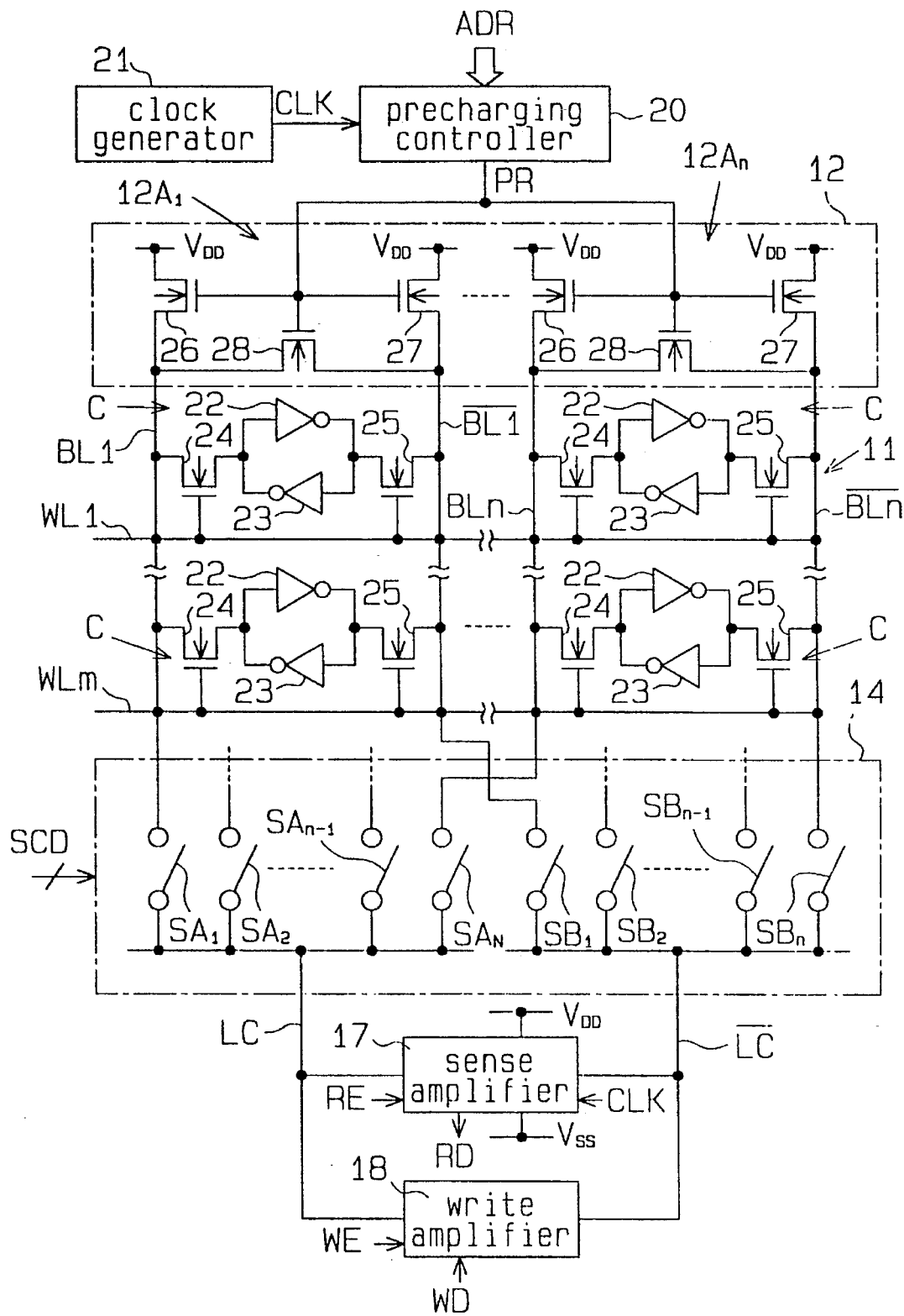
FIG. 6 is a circuit diagram showing in detail the precharger, memory cell array, and column switch in the SRAM presented in FIG. 5.

As shown in FIG. 6, the cell array 11 is provided with a plurality of word lines WL1 to WLm. Sequence term "m" may be, but need not be, set to 32 as in embodiment. The cell array is also provided with a plurality of bit line pairs (BL1, /BL1) to (BLn, /BLn). In this embodiment "n"0 is, but need not be, set to 8. Memory cells C are connected across each of the bit line pairs and word lines WL1 to WLm. It should be noted that FIG. 6 shows only word lines WL1 and WLm, and bit line pair (BL1, /BL1), and bit line pair (BLn,/BLn).

Each of the cells C is formed by a first and a second invertor 22 and 23, and a first and a second gate transistor 24 and 25 comprising N channel MOS transistors. Each of the input terminals of the first and second invertors 22 and 23 is connected to the output terminal of the other invertor, respectively. The first gate transistor 24 of each cell is connected across the associated bit lines BL1 to BLn, and the output terminal of the associated second invertor 23, respectively. The second gate transistor 25 of each cell is connected across the associated bit lines/BL1 to/BLn, and the associated first invertor 22, respectively. The first and second transistor gates 24 and 25 of each cell C are connected to each of the corresponding word lines WL1 to WLm, respectively. Then, either one of the word lines WL1 to WLm is selected, and, when the potential of the selected word line goes high, the first and second gate transistors 24 and 25 connected to this word line are turned on, respectively. Based on this operation of the first and second gate transistors 24 and 25, the data on these plural cells C are output onto the bit line pairs (BL1, /BL1) to (BLn, /BLn), respectively.

The cell array 11 is connected to the precharger 12. The precharger 12 is provided with a plurality of circuits $12A_1$ to $12A_n$ as charge elements corresponding to the bit line pairs (BL1, /BL1) to (BLn, /BLn), respectively. Each of the circuits $12A_1$ to $12A_n$ is provided with a 4th to 6th N channel MOS transistors 26, 27, and 28. The 4th transistor 26 of each charge element is connected across the power-supply $V_{DD}$ and each of the bit lines BL1 to BLn serving as the non-inverted side, respectively. The 6th transistor 27 of each charge element is connected across the power-supply $V_{DD}$ and each of the bit line /BL1 to /BLn serving as the inverted side, respectively. The 5th transistor 28 of each charge element is connected across each of the bit line pairs (BL1, BL1) to (BLn, /BLn), respectively. Each of the 4th to 6th transistors 26 to 28 is turned on during the period in which the precharge signal PR, output from the precharging controller 20, is high. Then, on the basis of this, the precharger 12 precharges all the bit line pairs (BL1, /BL1) to (BLn, /BLn) by means of the power-supply $V_{DD}$ to set the potential of each bit line pair equal to each other. (BL1, /BL1) to (BLn, /BLn), respectively. Each of the The cell array 11 is connected to the column switch 14. The column switch 14 is provided with a plurality of switching pairs ($SA_1$, $SB_1$) to ($SA_n$, $SB_n$) formed by N channel MOS transistors.

A first group of switches $SA_1$ to $SA_n$ is provided between the corresponding bit lines BL1 to BLn, and a first output line LC, respectively. A second group of switches $SB_1$ to $SB_n$ is provided between the corresponding bit lines /BL1 to /BLn, and a second output line /LC, respectively. By the application of a selected signal SCD from the column decoder 15, either one of the switching pairs ($SA_1$, $SB_1$) to ($SA_n$, $SB_n$) is turned on, thus selectively connecting the corresponding bit line and the output line pair (LC, /LC) through the activated switching pair.

As shown in FIG. 5, the address buffer 16 receives the clock signal CLK from the clock generator 21, and at the same time, receives an 8-bit address signal AD from a controller (not shown). The address signal AD comprises a higher 5-bit row address signal ADR, and a lower 3-bit column address signal ADC. The address buffer 16 holds the address signal AD in synchronism with the rising of the clock signal CLK, and then separates it into a row address signal ADR and a column address signal ADC. The buffer 16 supplies the row address signal ADR to the row decoder 13 and the precharging controller 20, and the column address signal ADC to the column decoder 15.

The control buffer 19 receives a read enable signal RE and a write enable signal WE from the controller, and outputs a control signal to the row decoder 13 and column decoder 15 corresponding to the both signals RE and WE. Also, the control buffer 19 outputs the read enable signal RE to the sense amplifier 17, and the write enable signal WE to the write amplifier 18.

The row decoder 13, as a word line selector, is connected to the word lines WL1 to WLm of the cell array 11. The row decoder 13 decodes the row address signal ADR in response to the control signal received from the control buffer 19, and outputs a selection signal SRD to control the potential levels of the word lines WL1 to WLm so that one of the word lines goes high and the others go low. In other words, the selection signal SRD operates to select one of the word lines WL1 to WLm, and to set it high.

The column decoder 15 is connected to the column switch 14. The column decoder 15 and column switch 14 constitute a bit line selector. The column decoder 15 decodes the address signal ADC in response to the control signal received from the control buffer 19, and generates a selection signal SCD. The column decoder 15 supplies such selection signal SCD to the column switch 14, and selectively connects either one pair of the bit line pairs (BL1, /BL1) to (BLn, /BLn) with the output line pair (LC,/LC).

As shown in FIG. 6, the column switch 14 is connected to the sense amplifier 17 and the write amplifier 18 through the output line pair (LC, /LC). Power is supplied from the power-supplies $V_{DD}$ and $V_{SS}$ to the sense amplifier 17 which receives clock signal CLK from the clock generator 21. The sense amplifier 17 is activated in response to the input read enable signal RE, and amplifies the data on the read-out cell C per each high level input pulse of the clock signal. Thus, the sense amplifier 17 outputs the amplified data as the read-out data RD.

The write amplifier 18 receives the write data WD from the controller (not shown), and at the same time receives the write enable signal WE from the control buffer 19. The write amplifier 18 is activated in response to the input write enable signal WE, and writes the write data WD onto the cell C through the output line pair (LC, /LC), and the selected bit line pair.

Figure 7:
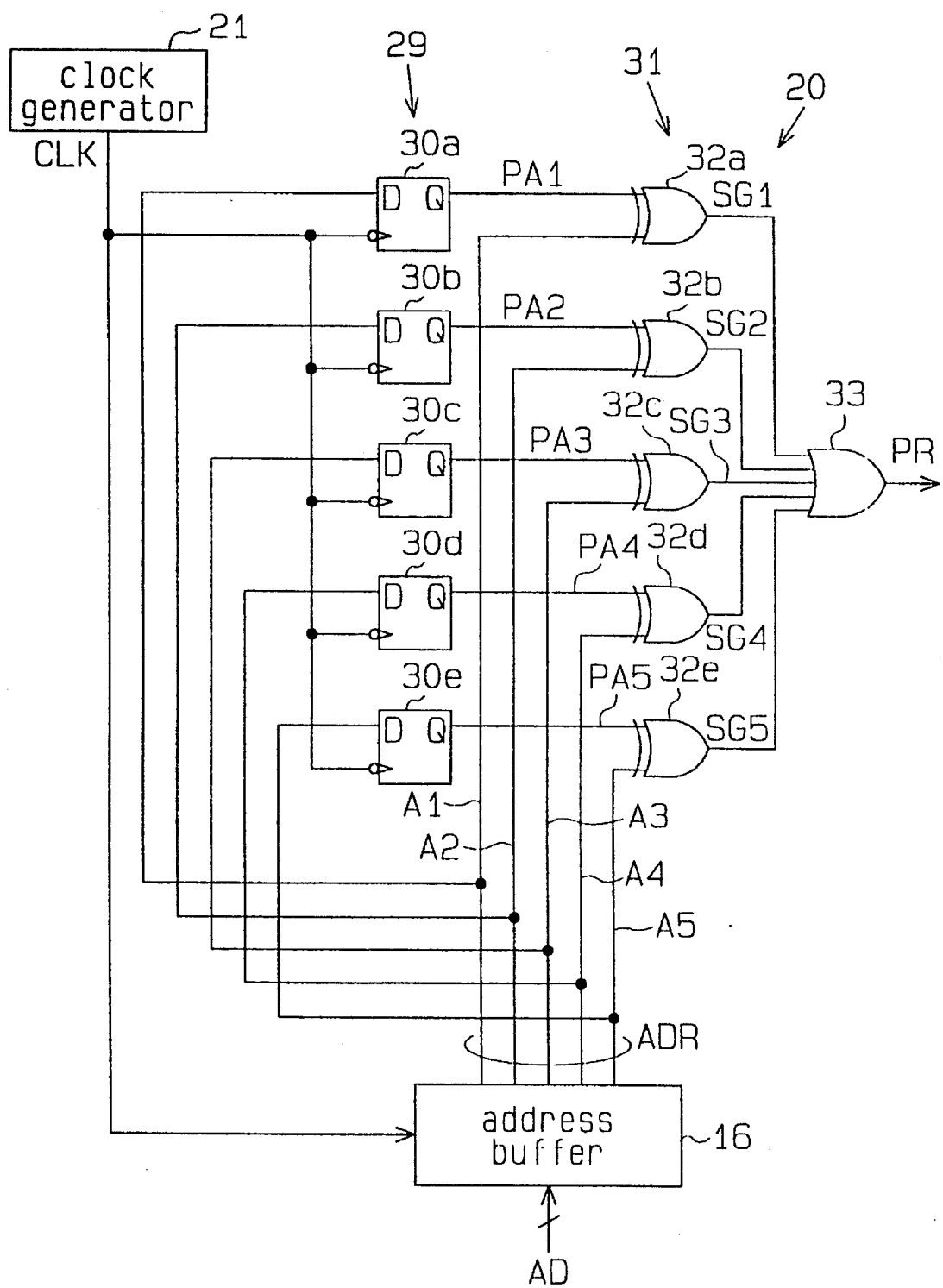
FIG. 7 is a circuit diagram showing a precharging controller in the SRAM presented in FIG. 5.
Figure 8A:
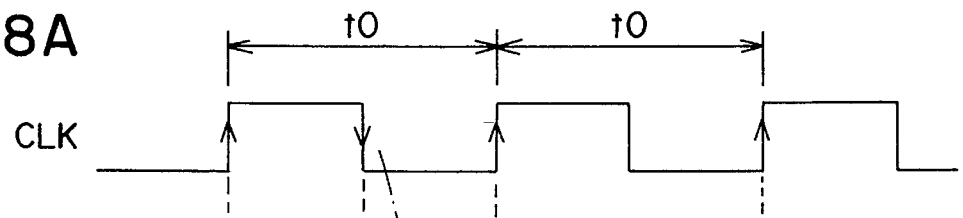
FIG. 8 is a time chart showing the reading operation in the SRAM presented in FIG. 5.
Figure 8B:
Figure 8C:
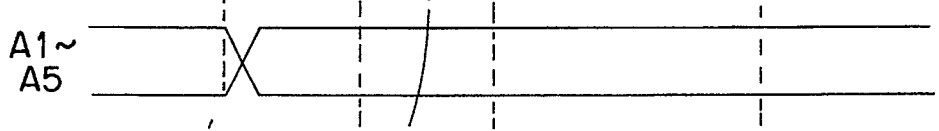
Figure 8D:
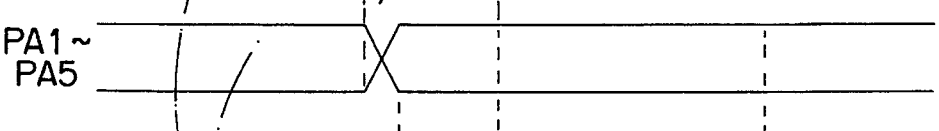
Figure 8E:
Figure 8F:
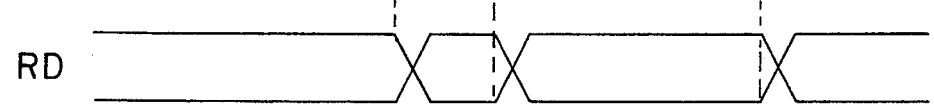

As shown in FIG. 7, the precharging controller 20 receives the row address signal ADR and the clock signal CLK. The controller 20 determines whether or not the word line selected previously, and the newly selected word line match each other based on the change of the row address signal ADR. If the row address signals do not correspond, the controller actuates the precharger 12.

The controller 20 comprises an address latch 29, a discriminator 31, and an OR circuit 33 as an output circuit. The latch 29 is formed by a plurality of flip-flops (hereinafter referred to as FF) 30a to 30e. Each of the FFs 30a to 30e is provided with an output terminal Q, a data terminal D to which each of the bit signals A1 to A5 of the row address signal ADR is input, and a clock terminal to which the clock signal CLK is input. Bit signals A1 to A5 correspond to the least significant bit to the most significant bit of the row address signal ADR. The FFs 30a to 30e latch the bit signals A1 to A5 in synchronism with the falling of the clock signal CLK which is delayed half a cycle of the rising of the CLK, and output each of the latched signals to the discriminator 31 as the secondary bit signals PA1 to PA5 respectively. Therefore, the FFs 30a to 30e maintain the output of the secondary bit signals PA1 to PA5 even when the address signal AD changes in synchronism with the rising of the clock signal CLK as shown in FIG. 8. Signals PA1 to PA5 here correspond to the previous row address signal ADR, which may itself be included in address signal AD.

The discriminator 31 is provided with a plurality of Exclusive OR (EOR) circuits 32a to 32e corresponding to the FFs 30a to 30e. The discriminator 31 determines whether or not the previous row address signal ADR (bit signals PA1 to PA5) from the address latch 29 matches with the new row address signal ADR (bit signals A1 to A5) which is input through the address buffer 16. Each of EOR circuits 32a to 32e is provided with a first input terminal to which the bit signals A1 to A5 are input directly from the address buffer 16, and a second input terminal to which the secondary bit signals PA1 to PA5 are input from the associated FFs, respectively. The EOR circuits 30a to 30e execute the exclusive OR operation in accordance with both of the input signals, and provide the output signals SG1 to SG5 as discriminating signals. When the levels of both of the input signals are identical, each of the EOR circuits 32a to 32e outputs the discriminating signals SG1 to SG5 carrying "0", respectively. Each of the EOR signals 32a to 32e outputs the discriminating signals SG1 to SG5 carrying "1", respectively, when the levels of both of the input signals are not identical.

The OR circuit 33 receives the discriminating signals SG1 to SG5, and if at least one of them carries "1", this circuit outputs a high level precharging signal PR to the precharger 12. In other words, the OR circuit 33 outputs the precharging signal PR high only when the row address signal ADR changes, thus actuating the precharger 12. Then, the precharger 12 precharges all the bit line pairs (BL1, /BL1) to (BLn, /BLn) in response to the high level input precharging signal PR.

A description will now be made of the reading operation of the data stored in the SRAM 10. At the beginning of the reading operation, the FFs 30a to 30e of the precharging controller 20 are initialized, and the bit signals PA1 to PA5 all carry "1".

The sense amplifier 17 is activated when receiving a read enable signal RE having H level. When the address buffer 16 receives an address signal AD, it latches the address signal AD in synchronism with the rising of the clock signal CLK.

The address buffer 16 then supplies the row address signal ADR to the row decoder 13 and the controller 20, and the column address signal ADC to the column decoder 15.

The row decoder 13 decodes the row address signal ADR to generate a selection signal SRD, and outputs such selection signal SRD to the cell array 11 to set the word line WL1 high, for example.

The column decoder 15 decodes the column address signal ADC to generate and output a selection signal SCD to the column switch 14. On the basis of signal SCD, a pair of switches ($SA_1$, $SB_1$) are turned on, and the bit line pair (BL1, /BL1), and the output line pair (LC, /LC) are connected. This allows for the selection of the cell C due to its connection to the word line WL1 and the bit line pair (BL1,/BL1).

At this time, each of the EOR circuits 32a to 32e determines whether or not the original (or primary) bit signals A1 to A5 and the secondary bit signals PA1 to PA5 match. When the signals do not coincide with each other in any one of the EOR 32a to 32e, the EOR circuit outputs a high level discriminating signal, i.e., the binary equivalent of "1". Then, as shown in FIG. 8, the OR circuit 33 sets the precharging signal PR high. In response to the high precharging signal PR, the 4th to 6th transistors 26 to 28 of each charge element turn on. Thus, the precharger 12 precharges the bit line pairs (BL1, /BL1) to (BLn, /BLn) by means of the power-supply $V_{DD}$.

Then, the FFs 30a to 30e latch the bit signals A1 to A5 from the address buffer 16 in synchronism with the falling of the clock signal CLK, and output them to the associated EOR gates as the secondary bit signals PA1 to PA5. Hence, the secondary bit signals PA1 to PA5 are made identical to the bit signals A1 to A5 which are output from the buffer 16 previously, and both sets, i.e., PA1 to PA5 and A1 to A5 respectively become identical in each of the EOR circuits 32a to 32e. As a result, each of the EOR circuits 32a to 32e outputs the discriminating signals SG1 to SG5, set low, i.e. to the binary equivalent of "0". Then, as shown in FIG. 8, the OR circuit 33 sets the precharging signal PR low to turn off the 4th to 6th transistors 26 to 28. In this way, the precharging of all the bit line pairs (BL1, /BL1) to (BLn, /BLn) is completed.

Based on the data in the selected cell C, a current flows to the low potential power-supply $V_{SS}$ from one of the bit line pairs (BL1, /BL1) through the transistor and invertor associated with the bit line. Then, the potential level of the bit line gets set to the level of the low potential power-supply $V_{SS}$, i.e., ground. The level of the complementary bit line is held at the level of the high potential power-supply $V_{DD}$, allowing the data of the cell C to be read out onto the bit line pair (BL1,/BL1) and from there to the sense amplifier 17 via the output line pair (LC,/LC). The amplifier 17 amplifies the data and outputs them as the read-out data RD.

Next, when the address is incremented by the controller, the address buffer 16 latches the address signal AD in synchronism with the rising of the clock signal CLK. At this time, the row address signal ADR (bit signals A1 to A5) remains constant. The column address signal ADC, however, changes. Accordingly, the word line WL1 is again selected. On the other hand, when the switches $SA_2$ and $SB_2$ turn on in accordance with a changed column address signal ADC, the bit line pair (BL2, /BL2) are connected to the output line pair (LC,/LC), allowing another cell C connected to the word line WL1 and the bit line pair (BL2,/BL2) to be selected.

Since the row address signal ADR does not change at this time, the previous bit signals A1 to A5 match the secondary bit signals PA1 to PA5. Therefore, all of the EOR circuits 32a to 32e output low level discriminating signals SG1 to SG5. Thus, as shown in FIG. 8, the OR circuit 33 maintains the precharging signal PR at a L level. Under these circumstances, the precharger 12 will not precharge the bit line pairs (BL1,/BL1) to (BLn,/BLn).

The precharger 12 has, however, already precharged the bit line pairs (BL1,/BL1) to (BLn,/BLn) in accordance with the previous clock signal CLK one cycle earlier. Therefore, one bit line of the bit line pair (BL2, /BL2) is pulled down to the ground potential $V_{SS}$ and data in the cell C is selected and read in the same manner as described above. The level of the other bit line is held at the level of the power-supply $V_{DD}$. THUS, the data on the cell C is read out onto the bit line pair (BL2,/BL2).

The data on the bit line pair (BL2,/BL2) is transferred to the sense amplifier 17 through the output line pair (LC,/LC). The amplifier 17 amplifies this data and outputs it as the read-out data RD. When the data are read out, the precharger 12 does not precharge all of the bit line pairs. Consequently, it is possible for the amplifier 17 to output the read-out data RD more quickly by an amount of the omitted precharging period. As a result, the amplifier 17 outputs the read-out data RD in synchronism with the rising of the clock signal CLK.

When the address is successively incremented by the controller, the address buffer 16 latches the address signal AD in synchronism with the rising of the clock signal CLK. At this time, the row address signal ADR (bit signal A1 to A5) does not change. The word line WL1 however remains continuously selected as long as the column address ADC changes. On the basis of the changed column address ADC, the switching pair (SA$_3$ and SB$_3$) successively turn on, allowing the bit line pair (BL3,/BL3) to successively connect to the output line pair (LC, /LC). Hence, the cell C connected to the word line WL1 and the bit line pairs (BL3,/BL3) to (BLn,/BLn) are selected in successive order.

Unless the row address signal ADR changes, the OR circuit 33 outputs a low level precharging signal PR as shown in FIG. 8. The precharger 12 does not precharge the bit line pairs (BL1,/BL1) to (BLn, /BLn). However, the bit line pairs (BL3,/BL3) to (BLn,/BLn) are charged by the precharging performed by the precharger 12 when the previous data is read out. Consequently, there is no need for any precharging when the data in the successively selected cells C is read out onto the bit line pairs.

Further, assume that when the address is incremented, for instance, the bit signal A1 of the row address signal ADR and the column address signal ADC change. The word line WL2 is selected at that time on the basis of the changed row address signal ADR. Based on the changed column address signal ADC, the switching pair SA$_1$ and SB$_1$ turn on, and the bit line pair (BL1,/BL1) connects to the output line pair (LC,/LC). This allows the cell C, connected to the word line WL2 and the bit line pair (BL1, /BL1), to be selected.

Should the bit signal A1 of the row address signal ADR change, the bit signal A1 will not match the secondary bit signal PA1, causing the EOR circuit 32a to output a high level discriminating signal SG1. The OR circuit 33 next outputs a high level precharging signal PR. The precharger 12 precharges all of the bit line pairs (BL1,/BL1) to (BLn, /BLn) by means of the power-supply $V_{DD}$.

The FFs 30a to 30e latch the bit signals A1 to A5 in synchronism with the falling of the clock signal CLK, and output the latched signals as the secondary bit signals PA1 to PA5. Then, the EOR circuits 32a to 32e outputs all of the discriminating signals SG1 to SG5 low, while the OR circuit 33 outputs a low level precharging signal PR. In this way, the precharger 12 completes the precharging of all the bit line pairs (BL1,/BL1) to (BLn,/BLn).

Thus, the data on the selected cell C is read out onto the selected bit line pair (BL1, /BL1), and transferred to the sense amplifier 17 through the output line pair (LC, /LC). The amplifier 17 amplifies the data and outputs it as read-out data RD.

Thereafter, the address signal AD is incremented one after the other another. The cell selected in the same manner as described above changes one after the other along the bit lines. The sense amplifier 17 amplifies the data on the cell at each time the selected cell changes, and outputs it as read-out data RD.

In this way, the SRAM 10 of the present embodiment precharges the bit line pairs (BL1, /BL1) to (BLn, /BLn) only when the previously selected word line and the word line to be selected next differ from each other. In other words, when the previously selected word line and the word line to be selected next match with each other, the bit line pairs (BL1,/BL1) to (BLn,/BLn) are not precharged. This means that the consumed power of the SRAM 10 is reduced, thus making it possible to reduce the consumed power of the SRAM 10. As a result, should this SRAM 10 be employed as a memory device from which programmed data is successively read out via an incremented address signal AD, the power needed by the SRAM to operate can even further be reduced.

According to the present embodiment, if the word line selection is fixed, none of the bit line pairs will be precharged. Therefore, when the data on a plurality of memory cells C connected to the same word line is read, it will be unnecessary to arrange a time to precharging the data on the second cell C and thereafter. This results in an increase in the data reading speed of the SRAM 10.

Although only one embodiment of the present invention has been described herein, it should be apparent to those skilled in the art that the present invention may be embodied in many other specific forms without departing from the spirit or scope of the invention. Particularly, it should be understood that this invention may be implemented in the embodiment given below.

It is possible to apply this invention to a dynamic RAM (DRAM), a ROM, an EPROM, and other semiconductor memory devices provided with a precharger for precharging a plurality of bit lines.

Therefore, the present example and embodiments are to be considered as illustrative and not restrictive and the invention is not to be limited to the details given herein, but may be modified within the scope of the appended claims.

What is claimed is:

1. A semiconductor memory device comprising:

a memory cell array including a plurality of word lines, a plurality of bit lines, and a plurality of memory cells connected to each of the word lines and bit lines, respectively;

a word line selector connected to said word lines for selecting one of said word lines in accordance with a row address signal;

a bit line selector connected to said bit lines for selecting one of said bit lines in accordance with a column address signal;

a precharger for setting the potential of each of said bit lines to a potential before data is read out onto the bit lines from said memory cells; and a controller responsive to said row address signal to activate said precharger to precharge said bit lines, when different word lines are selected in succession by said word line selector in response to a change in said row address signal;

an address buffer for maintaining address signals including the row address signal and the column address signal, such that said row address signal is supplied to said word line selector and said controller and said column address signal is supplied to said bit line selector;

a memory cell array including a plurality of word lines, a plurality of bit lines, and a plurality of memory cells connected to each of the word lines and bit lines, respectively;

a word line selector connected to said word lines for selecting one of said word lines in accordance with an address signal;

a bit line selector connected to said bit lines for selecting one of said bit lines in accordance with an address signal;

a precharger for setting the potential of each of said bit lines to a potential before data is read out onto the bit lines from said memory cells;

a controller responsive to said address signal to activate said precharger when different word lines are selected in succession by said word line selector, further comprising an address buffer for maintaining said address signal, wherein said address signal includes a row address signal and a column address signal maintained by said address buffer, said row address signal being supplied by the address buffer to said word line selector and said column address signal being supplied by the address buffer to said bit line selector;

an address latch for latching a plurality of primary row address bit signals and outputting them as secondary row address signals;

a discriminator for determining whether or not said secondary row address signal and said primary row address signal match, and for outputting a discrimination signal in response thereto; and an output circuit for receiving the output signal from the discriminator, and for outputting a signal to activate said precharger when the primary and secondary signals do not match;

wherein said address latch comprises a plurality of flip-flops supplied with said primary row address bit signals, wherein said discriminator comprises a plurality of exclusive OR circuits supplied with the output from said flip-flops; and wherein said output circuit comprises an OR circuit to which the output signal from each of said exclusive OR circuits is input, said semiconductor memory device further comprising a clock generator for supplying the clock signal to said flip-flops and address buffer, to control the latching of said primary row address signals by said flip-flops.

2. A semiconductor memory device comprising:

a memory cell array including a plurality of word lines, a plurality of bit lines, and a plurality of memory cells connected to each of the word lines and bit lines, respectively;

a word line selector connected to said word lines for selecting one of said word lines in accordance with a row address signal;

a bit line selector connected to said bit lines for selecting one of said bit lines in accordance with a column address signal;

a precharger for setting the potential of each of said bit lines to a potential before data is read out onto the bit lines from said memory cells; and a controller responsive to said row address signal to activate said precharger to precharge said bit lines, when different word lines are selected in succession by said word line selector in response to a change in said row address signal, said controller comprising
 an address latch for latching a plurality of primary row address bit signals and outputting them as secondary row address signals,
 a discriminator for determining whether or not said secondary row address signal and said primary row address signal match, and for outputting a discrimination signal in response thereto, and
 an output circuit for receiving the output signal from the discriminator, and for outputting a signal to activate said precharger when the primary and secondary signals do not match;

wherein said address latch comprises a plurality of flip-flops supplied with said primary row address bit signals; wherein said discriminator comprises a plurality of exclusive OR circuits supplied with the output from said flip-flops; and wherein said output circuit comprises an OR circuit to which the output signal from each of said exclusive OR circuits is input, said semiconductor memory device further comprising
 a clock generator for supplying the clock signal to said flip-flops, to control the latching of said primary row address signals by said flip-flops.

* * * * *